(12) United States Patent
Yang

(10) Patent No.: US 10,307,874 B2
(45) Date of Patent: Jun. 4, 2019

(54) METHOD FOR SEALING A HEAT TRANSFER UNIT

(71) Applicant: ASIA VITAL COMPONENTS CO., LTD., New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 70 days.

(21) Appl. No.: 14/590,926

(22) Filed: Jan. 6, 2015

(65) Prior Publication Data

US 2016/0193702 A1   Jul. 7, 2016

(51) Int. Cl.
*B23P 15/26* (2006.01)
*F28D 15/02* (2006.01)
*F28D 15/04* (2006.01)
*H01L 21/48* (2006.01)
*H01L 23/427* (2006.01)

(52) U.S. Cl.
CPC .......... *B23P 15/26* (2013.01); *F28D 15/0283* (2013.01); *F28D 15/04* (2013.01); *H01L 21/4882* (2013.01); *B23P 2700/09* (2013.01); *F28F 2255/00* (2013.01); *F28F 2275/06* (2013.01); *H01L 23/427* (2013.01)

(58) Field of Classification Search
CPC . H01L 23/427; F28D 15/0233; F28D 15/046; Y10T 29/49353
See application file for complete search history.

(56) References Cited

U.S. PATENT DOCUMENTS

| 6,230,407 B1* | 5/2001 | Akutsu | F28D 15/0233 |
| | | | 29/890.03 |
| 6,530,420 B1* | 3/2003 | Takada | C09K 5/04 |
| | | | 165/104.26 |
| 6,896,040 B2* | 5/2005 | Hul-Chun | F28D 15/046 |
| | | | 165/104.21 |
| 7,467,466 B2* | 12/2008 | Hou | B23P 15/26 |
| | | | 165/104.18 |
| 2005/0051301 A1* | 3/2005 | Hsu | F28D 15/0283 |
| | | | 165/104.21 |
| 2006/0213063 A1* | 9/2006 | Lin | B23P 15/26 |
| | | | 29/890.032 |

(Continued)

FOREIGN PATENT DOCUMENTS

| CN | 100413613 C | 8/2008 |
| CN | 101623814 B | 4/2011 |
| TW | 200510088 | 3/2005 |

*Primary Examiner* — Jacob J Cigna
*Assistant Examiner* — Lee A Holly
(74) *Attorney, Agent, or Firm* — C. G. Mersereau; DeWitt LLP

(57) ABSTRACT

The present invention relates to a method for sealing a heat transfer unit, which includes the steps of providing a heat transfer unit having at least one opening, welding the opening to form a welding section and close the opening, and pinching off the welding section and cutting part of the welding section to form a cutting end and complete sealing the opening of the heat transfer unit. By means of the method of the present invention, an extremely short dead zone can be obtained and high heat conduction efficiency is enhanced, further having the effects of reducing the arrangement space and shrinking steps of the heat pipe.

2 Claims, 16 Drawing Sheets

(56) References Cited

U.S. PATENT DOCUMENTS

2006/0213647 A1* 9/2006 Lin .................. B23P 15/26
                                         165/104.26
2011/0168358 A1* 7/2011 Wu .................. F28D 15/0266
                                         165/104.26

* cited by examiner

METHOD FOR SEALING A HEAT TRANSFER UNIT

BACKGROUND OF THE INVENTION

Field of the Invention

The present invention relates to a method for sealing a heat transfer unit and in particular to a method for sealing a heat transfer unit, which significantly reduces the length of the dead zone and improves heat conduction efficiency.

Description of Prior Art

With the rapid development of electronic information industry, the processing capability of the electronic device such as a CPU increasingly grows with the increasing generated heat. The heat-dissipation module combining a heat-dissipation fin and a fan has not been able to meet the requirement of heat dissipation, especially for a notebook computer. The heat pipe is a currently and commonly used device for heat transfer. The heat pipe can be considered a passive heat transfer device with high heat conductivity. Using the mechanism of two-phase heat transfer, the heat transfer capability of the heat pipe is hundreds times as large as copper having the same size. The heat pipe used as a medium of heat transfer has the advantages of fast response and small heat resistance. Therefore, the highly efficient heat-dissipation module developed from the heat pipe or its derived product is suitable to solve the heat-dissipation problems caused by high performance electronic products.

As for the traditional method for sealing a heat pipe, the heat pipe is firstly vacuumed through a pipe opening and a working liquid is filled in the heat pipe. Then, the pipe opening is stretched and shrinks to form a necking end. Next, welding (e.g., argon welding) is performed at the necking end. In this way, the necking end is sealed. However, the necking section of the traditional heat pipe cannot conduct heat, which results in a dead zone of heat transfer. The dead zone will lower heat conduction efficiency of the heat pipe (that is, poor heat conduction of the heat pipe). Also, the necking section of the heat pipe is longer, which shortens the effective heat transfer length of the heat pipe such that when the heat pipe is installed in a smart mobile device such as a smart watch, a smart phone, or a wearable device, the occupied space of the heat pipe will make the assembly of the smart mobile device difficult, which is unfavorable to the shrinking of the smart mobile device.

Therefore, how to overcome the above problems and disadvantages is the focus which the inventor and the related manufacturers in this industry have been devoting themselves to.

SUMMARY OF THE INVENTION

Thus, to effectively overcome the above problems, the primary objective of the present invention is to provide a method for sealing a heat transfer unit, which can effectively reduce the length of the dead zone and improves heat conduction efficiency Another objective of the present invention is to provide a method for sealing a heat transfer unit, which can effectively reduce the arrangement space when the sealed heat pipe is used.

Yet another objective of the present invention is to provide a method for sealing a heat transfer unit, which can reduce the shrinking steps of the heat pipe.

To achieve the above objectives, the present invention provides a method for sealing a heat transfer unit, which includes the steps of (a) to (c). Step (a) provides a heat transfer unit having a chamber and forming at least one opening, wherein an inner wall of the chamber forms at least one wick structure, wherein a working fluid is filled in the chamber; Step (b) welds the opening to form a welding section and close the opening; and Step (c) pinches off the welding section and cuts part of the welding section to form a cutting end and complete sealing the opening of the heat transfer unit. By means of the method of the present invention, an extremely short dead zone can be obtained and high heat conduction efficiency is enhanced, further having the effects of reducing the arrangement space and shrinking steps of the heat pipe.

DETAILED DESCRIPTION OF THE INVENTION

Figure 1:
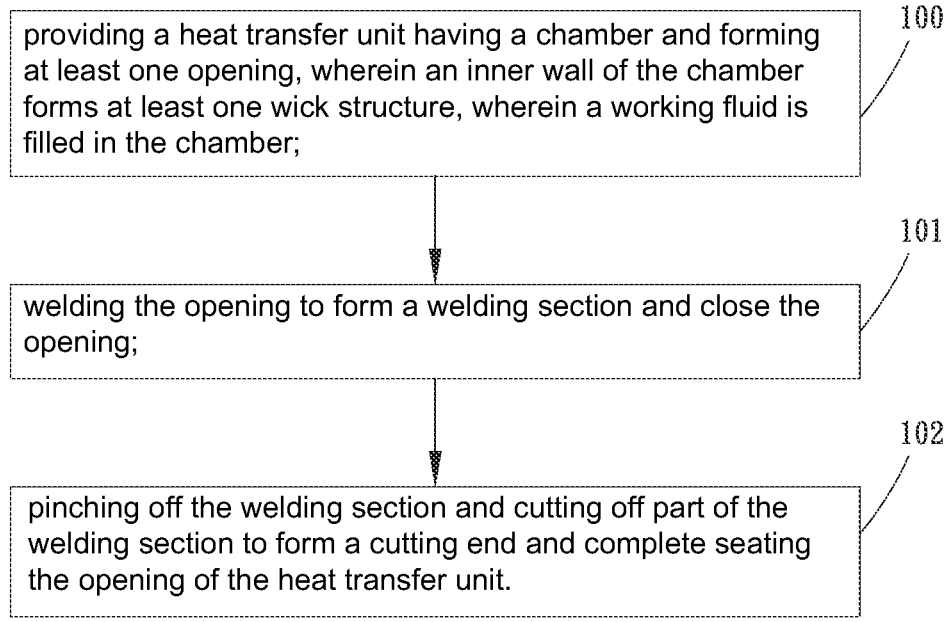
FIG. 1 is a flow chart of the method for sealing a heat transfer unit according to the first embodiment of the present invention.
Figure 2A:
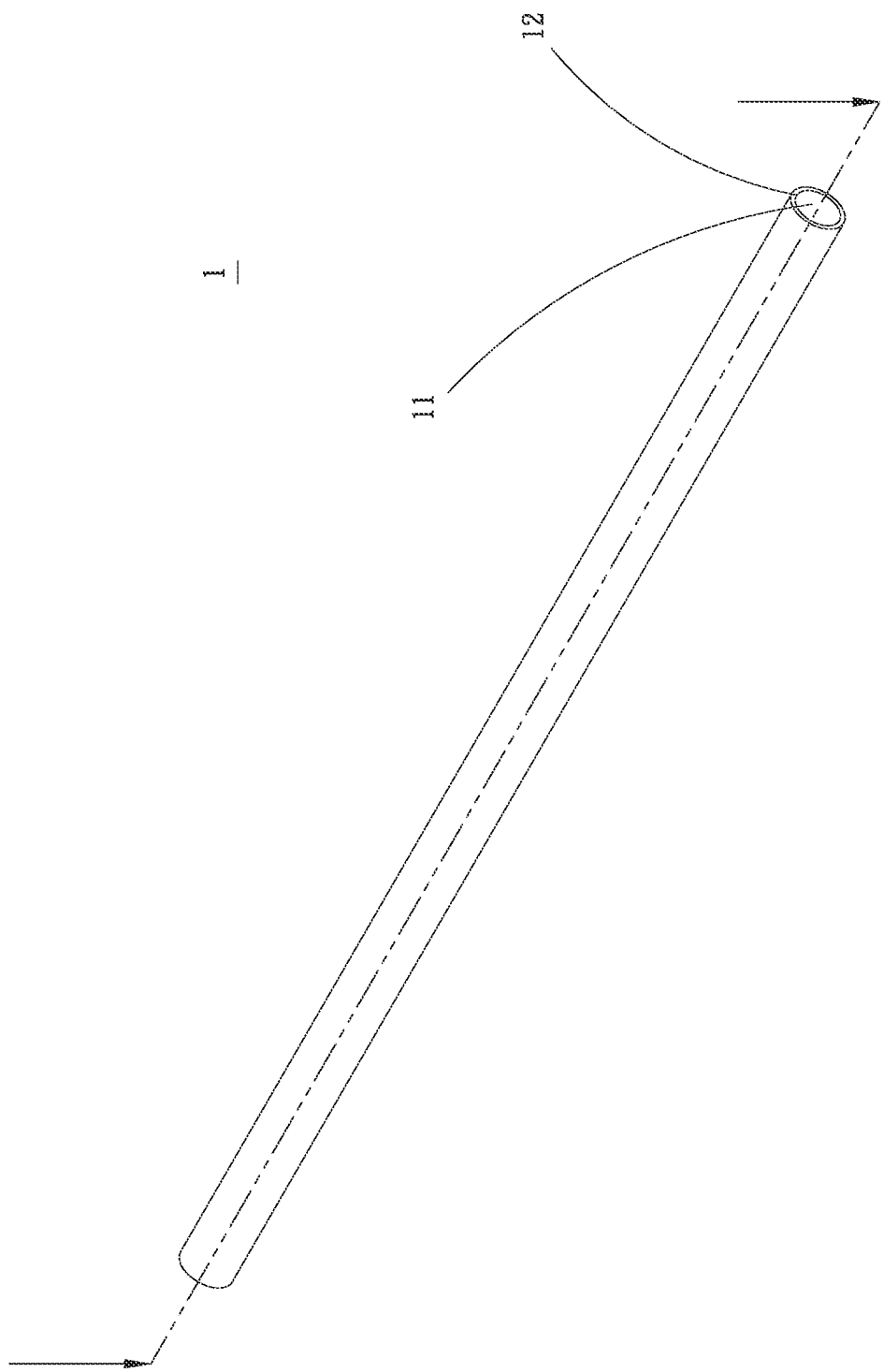
FIG. 2A is a schematic view of a method for sealing a heat transfer unit according to the first preferred embodiment of the present invention in the first state.
Figure 2B:
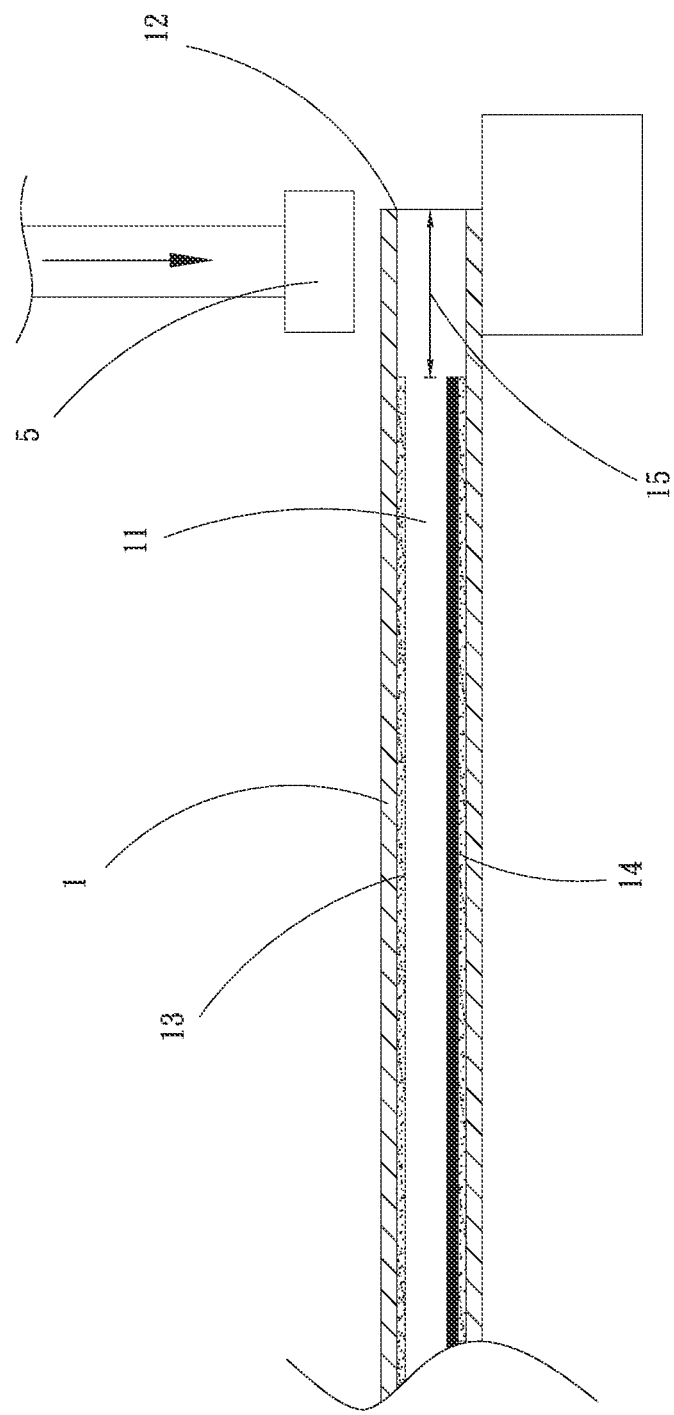
FIG. 2B is a schematic view of a method for sealing a heat transfer unit according to the first preferred embodiment of the present invention in the second state.
Figure 2C:
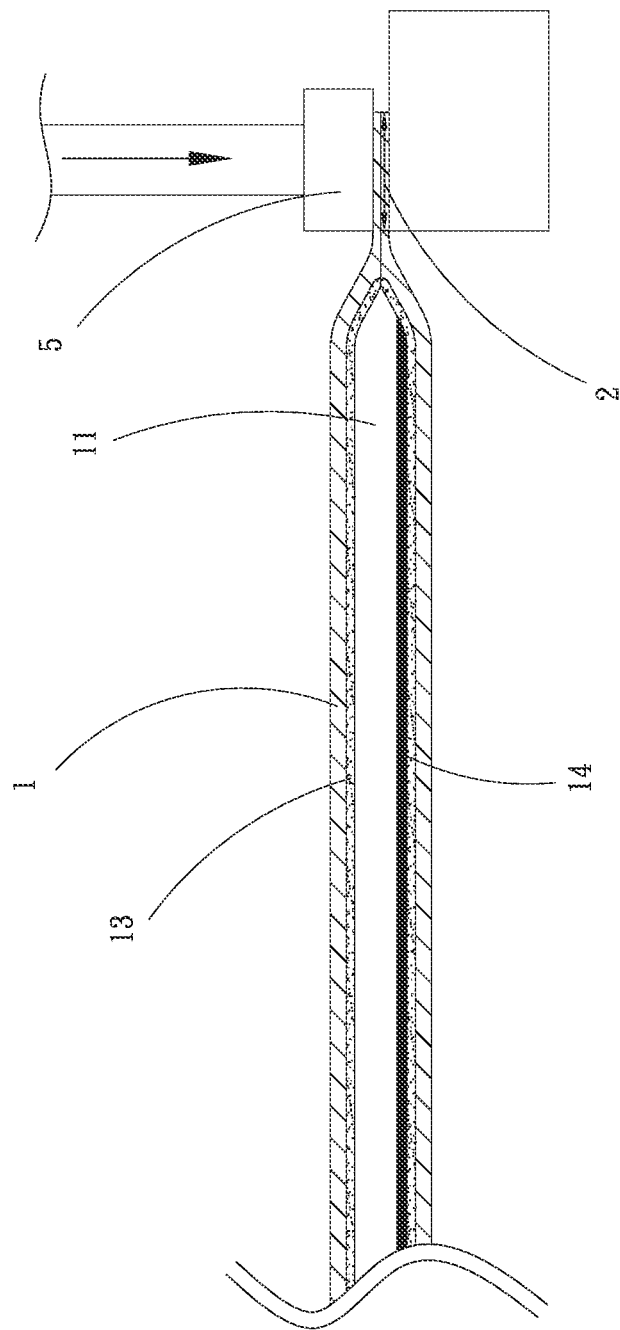
FIG. 2C is a schematic view of a method for sealing a heat transfer unit according to the first preferred embodiment of the present invention in the third state.
Figure 2D:
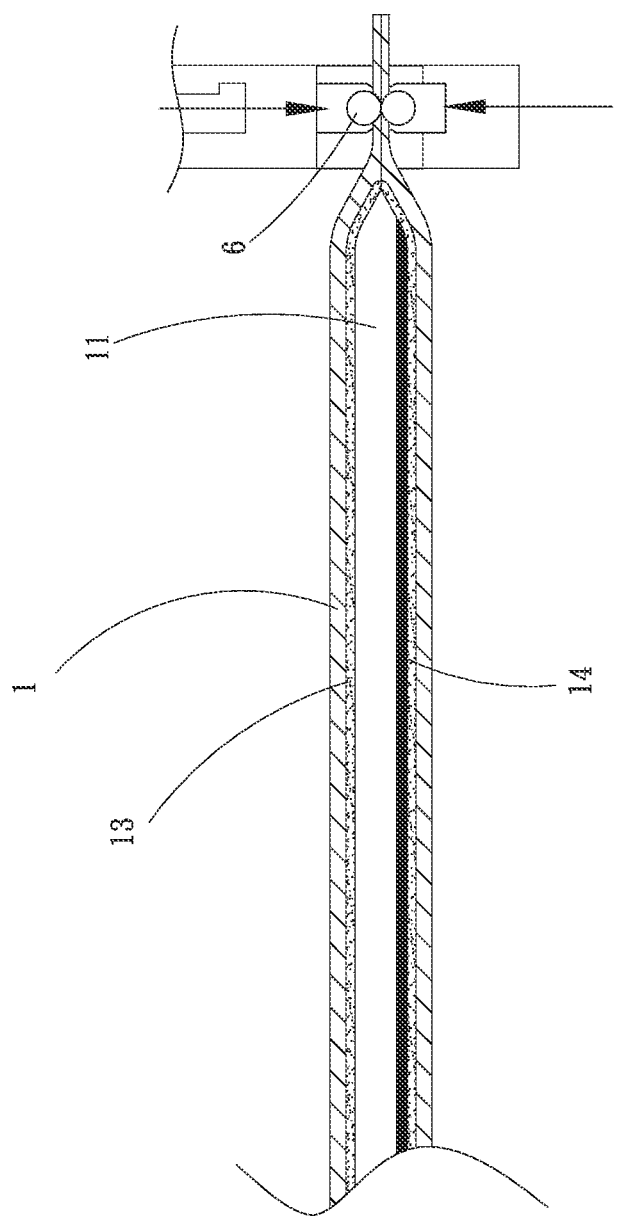
FIG. 2D is a schematic view of a method for sealing a heat transfer unit according to the first preferred embodiment of the present invention in the fourth state.
Figure 3:
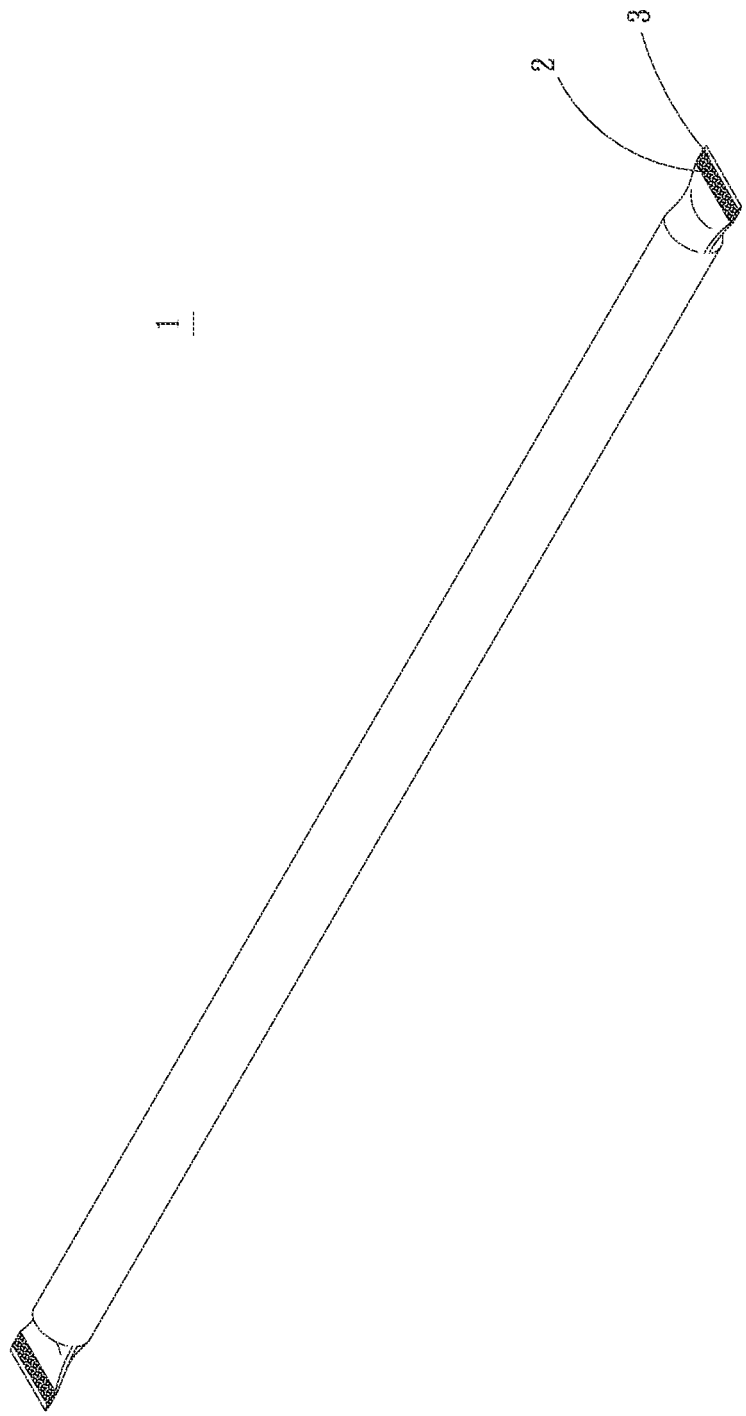
FIG. 3 is a view of the finished product made by the method for sealing a heat transfer unit according to the first preferred embodiment of the present invention.
Figure 4A:
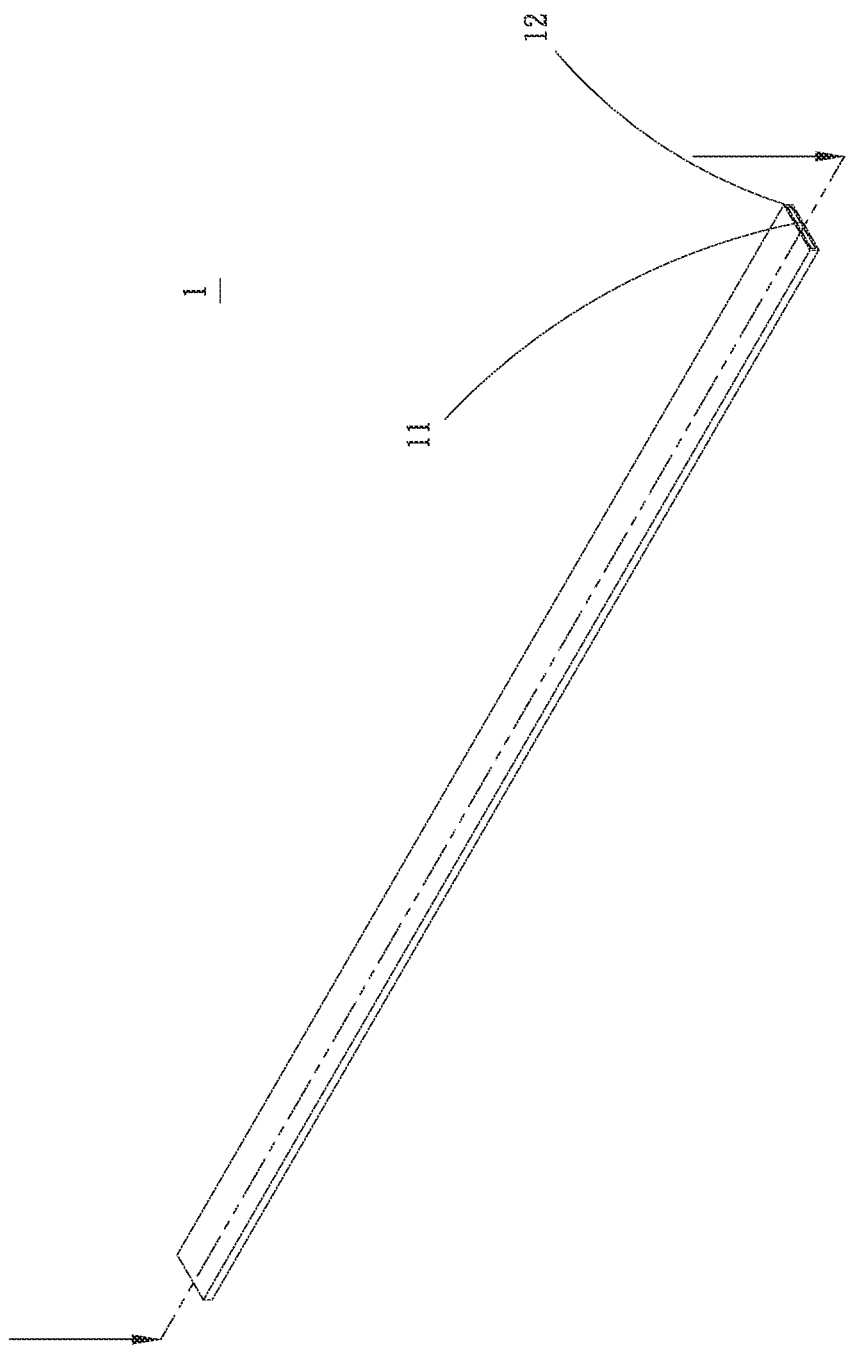
FIG. 4A is a schematic view of a method for sealing a heat transfer unit according to the second preferred embodiment of the present invention in the first state.
Figure 4B:
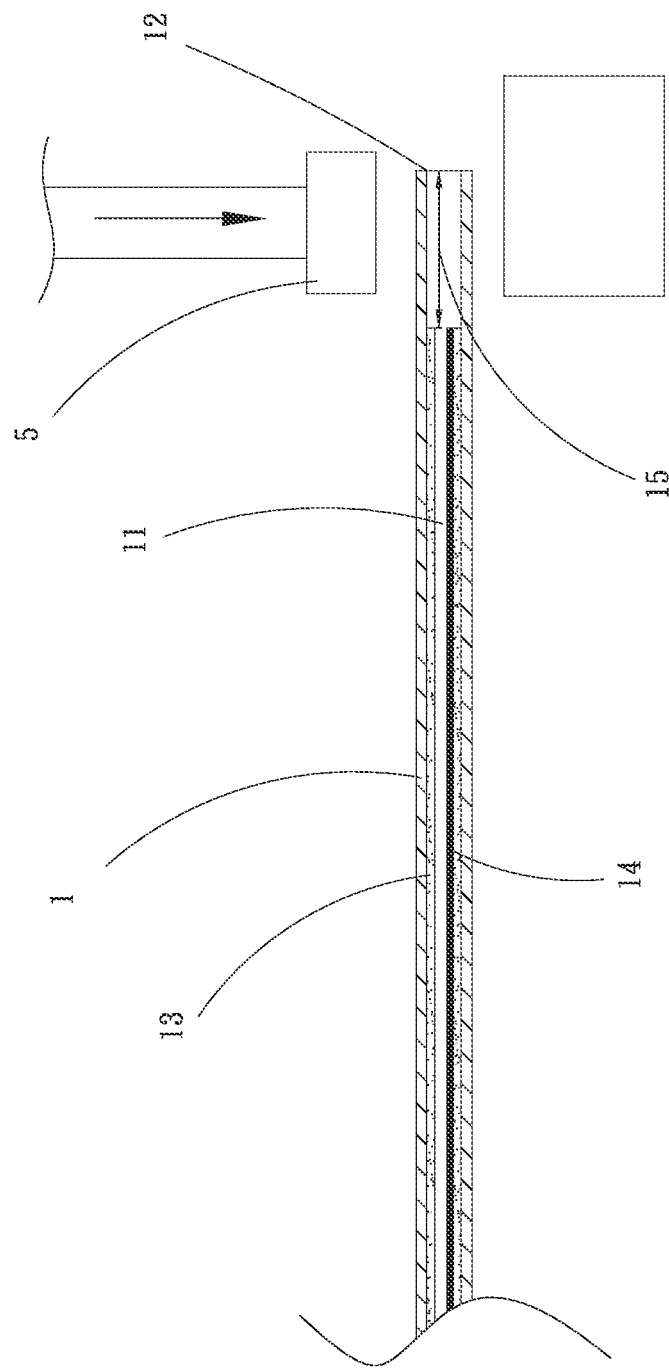
FIG. 4B is a schematic view of a method for sealing a heat transfer unit according to the second preferred embodiment of the present invention in the second state.
Figure 4C:
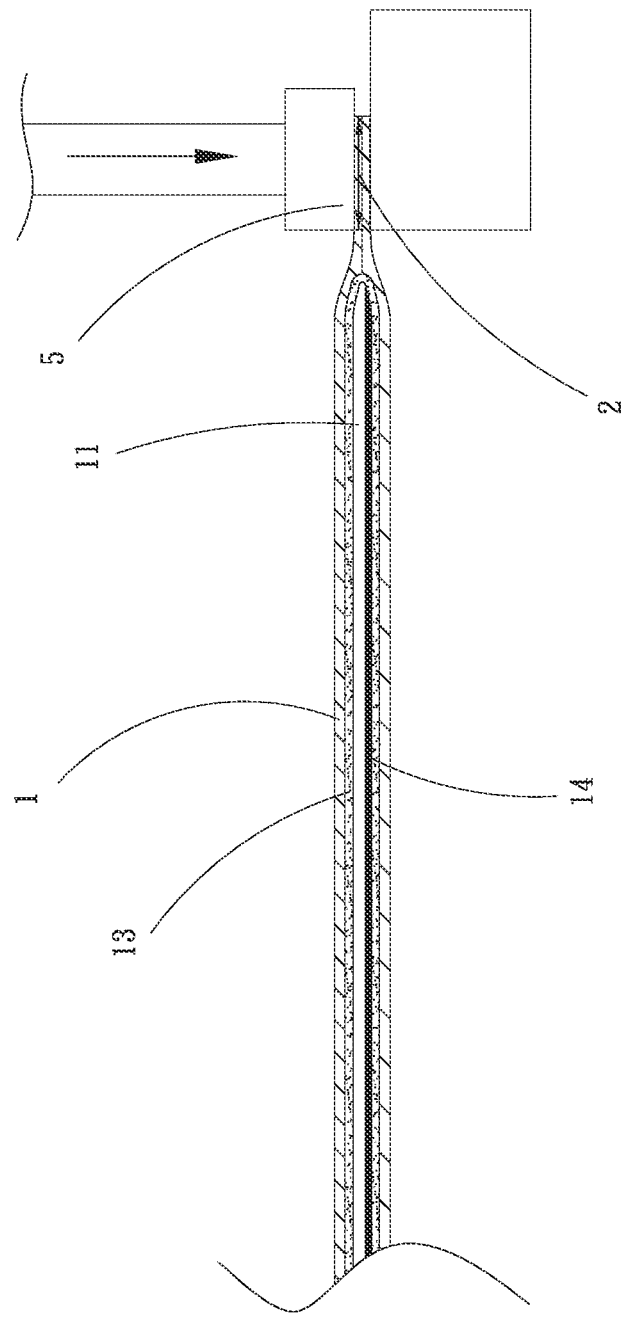
FIG. 4C is a schematic view of a method for sealing a heat transfer unit according to the second preferred embodiment of the present invention in the third state.
Figure 4D:
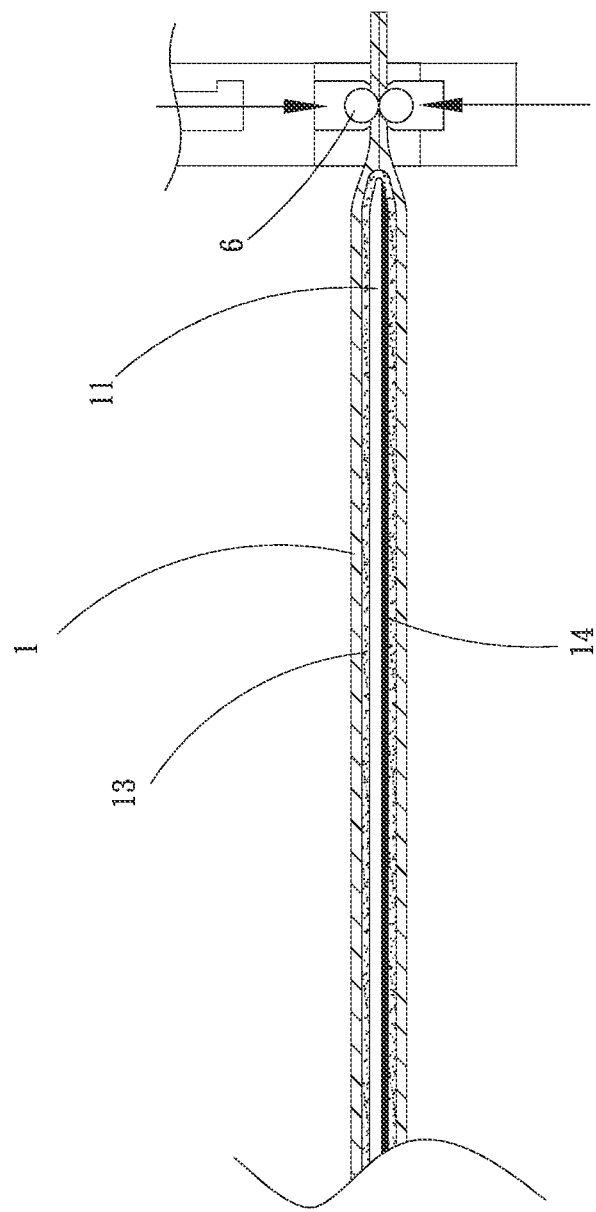
FIG. 4D is a schematic view of a method for sealing a heat transfer unit according to the second preferred embodiment of the present invention in the fourth state.
Figure 5:
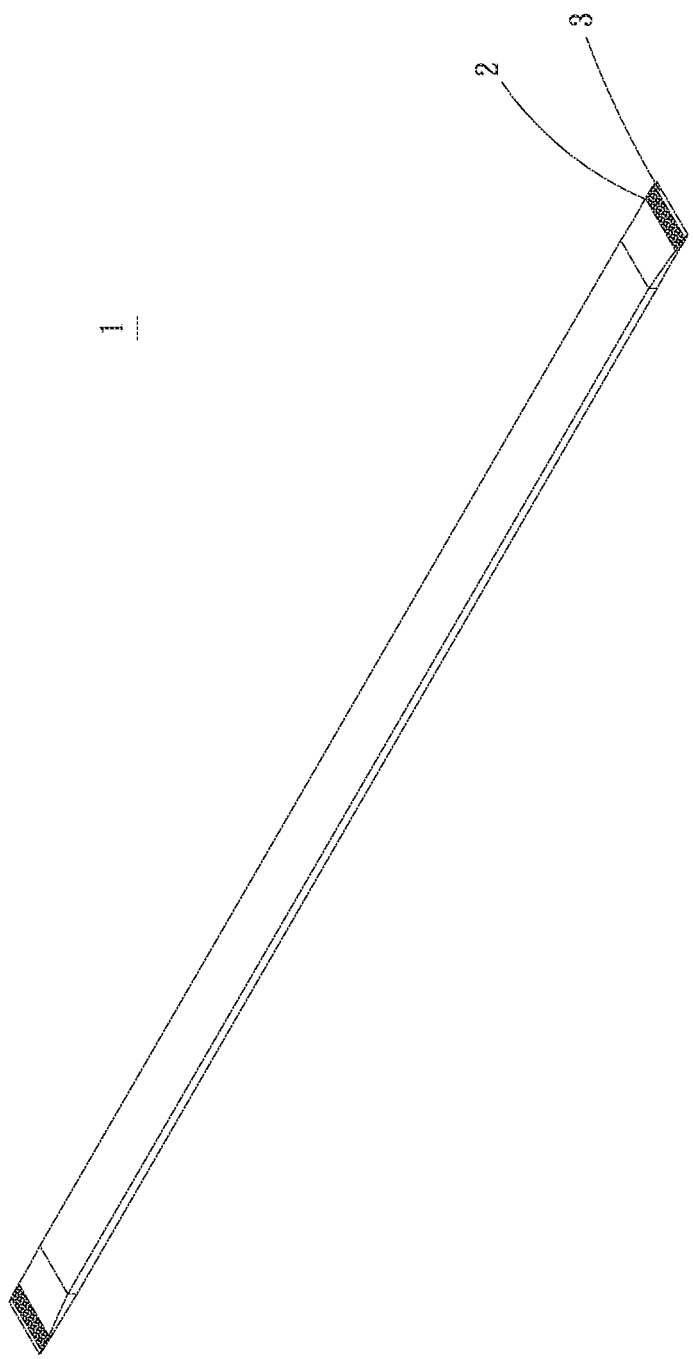
FIG. 5 is a view of the finished product made by the method for sealing a heat transfer unit according to the second preferred embodiment of the present invention.
Figure 6A:
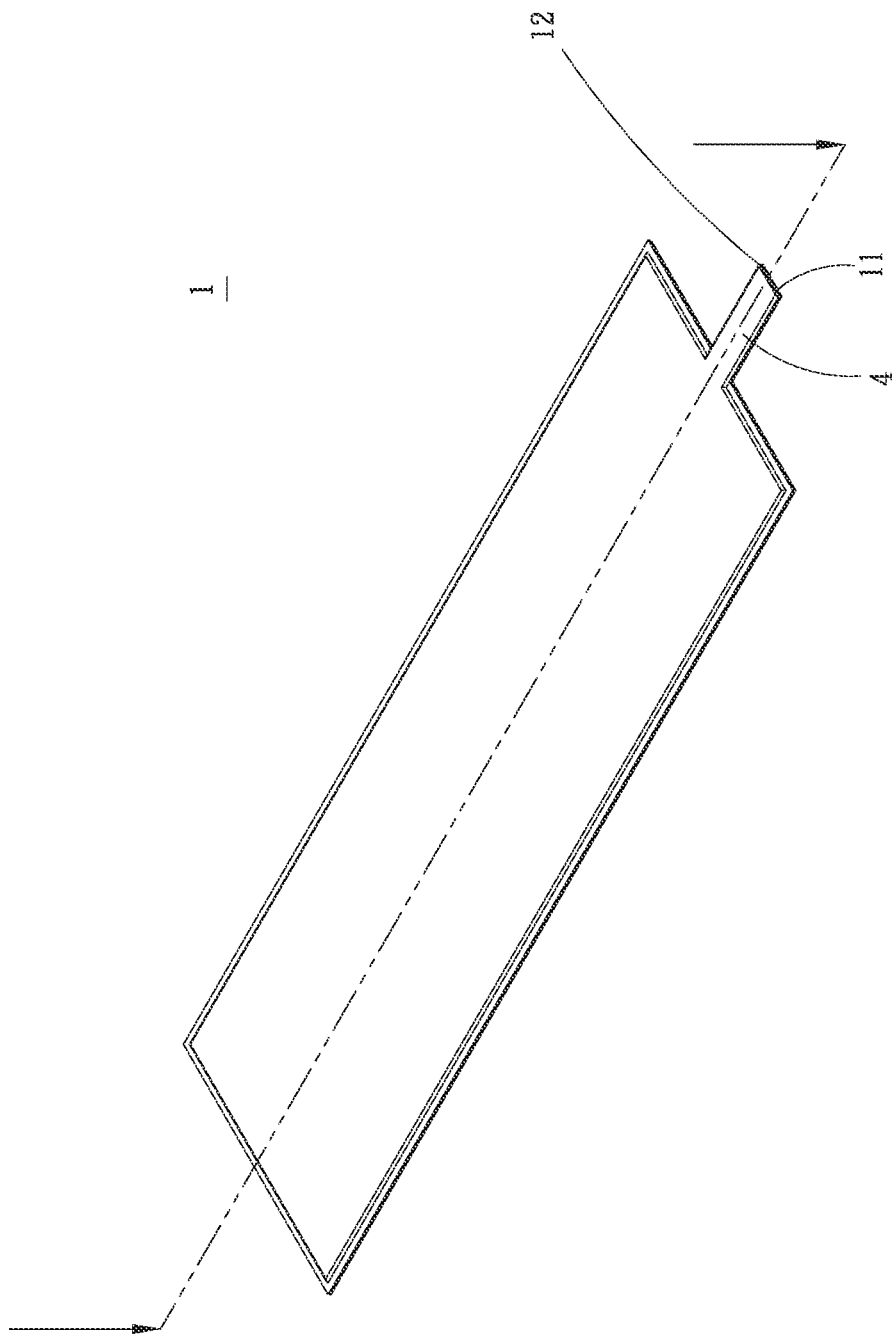
FIG. 6A is a schematic view of a method for sealing a heat transfer unit according to the third preferred embodiment of the present invention in the first state.
Figure 6B:
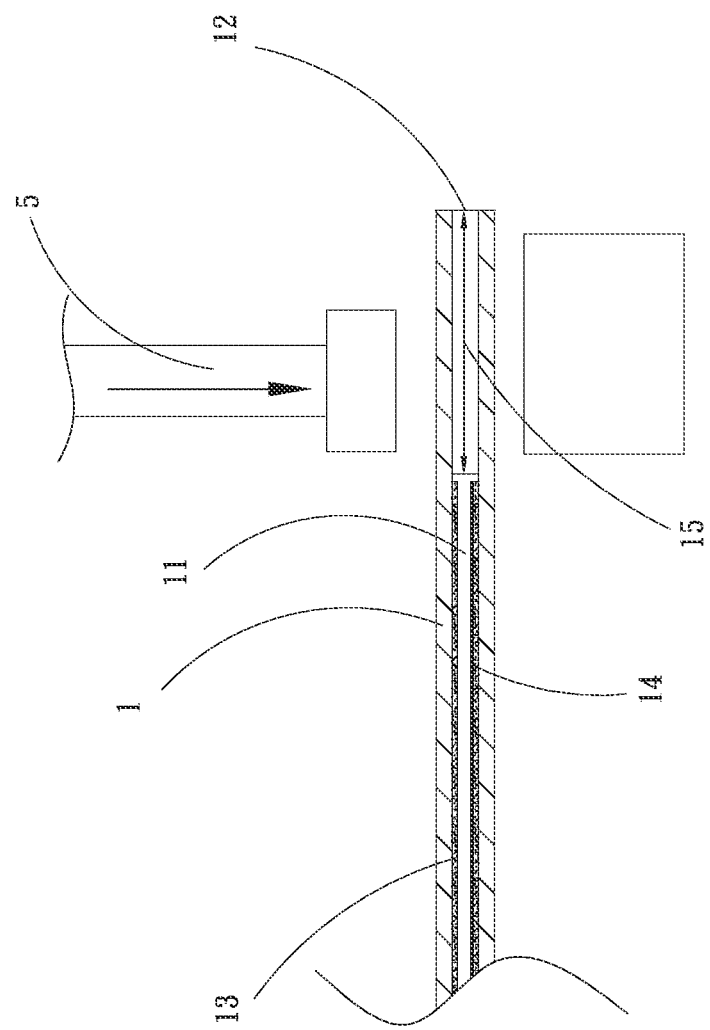
FIG. 6B is a schematic view of a method for sealing a heat transfer unit according to the third preferred embodiment of the present invention in the second state.
Figure 6C:
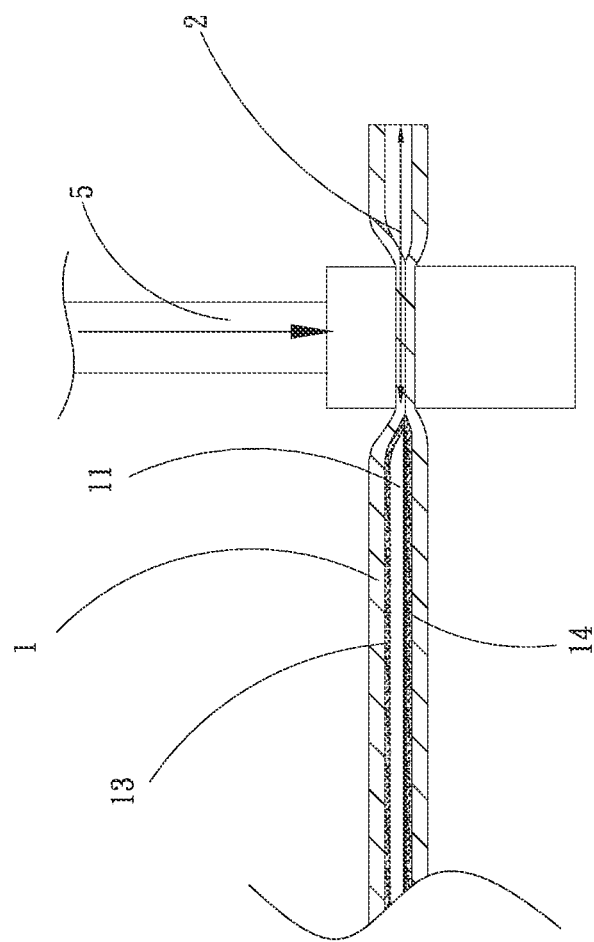
FIG. 6C is a schematic view of a method for sealing a heat transfer unit according to the third preferred embodiment of the present invention in the third state.
Figure 6D:
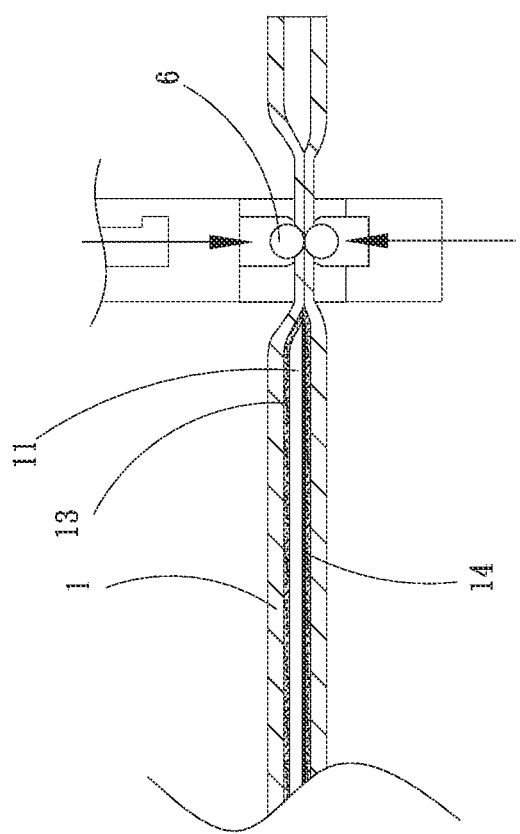
FIG. 6D is a schematic view of a method for sealing a heat transfer unit according to the third preferred embodiment of the present invention in the fourth state.
Figure 7:
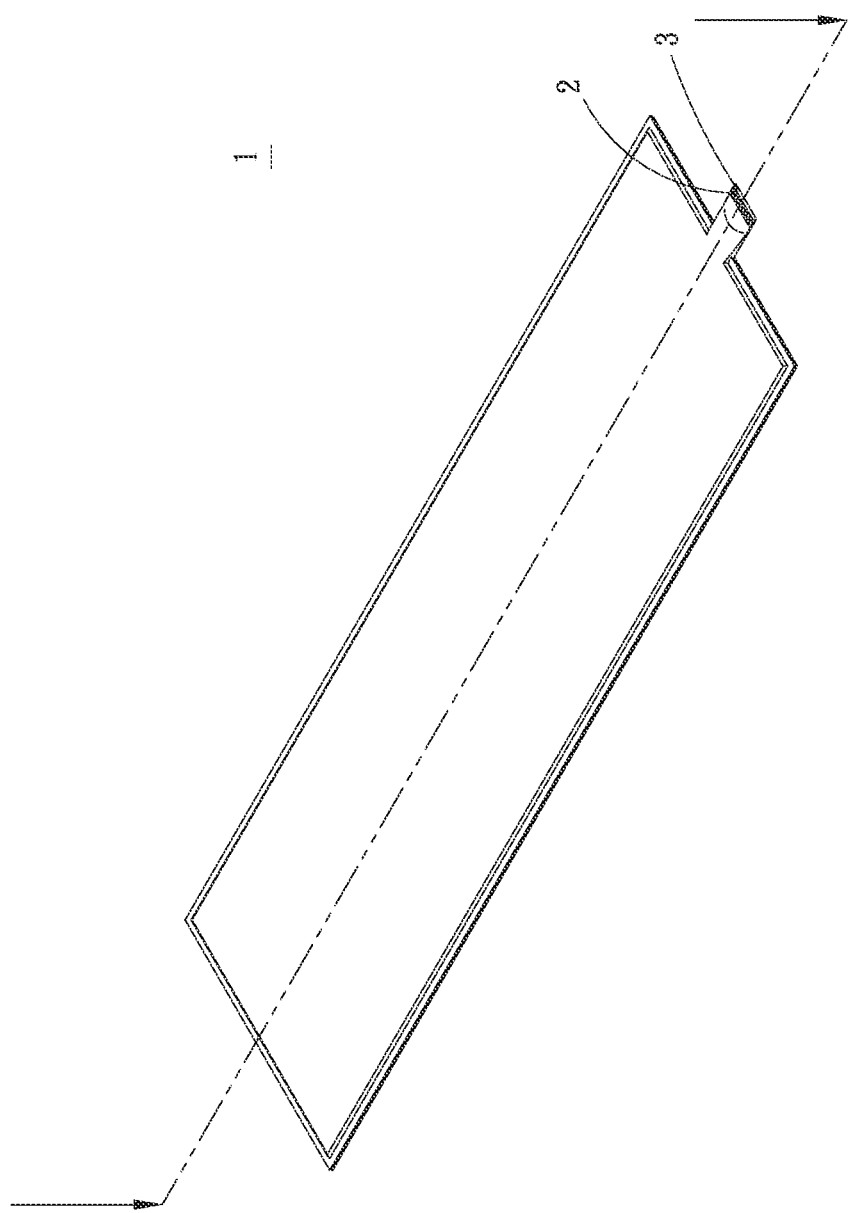
FIG. 7 is a view of the finished product made by the method for sealing a heat transfer unit according to the third preferred embodiment of the present invention.

The present invention is to provides a method of removing the dead zone of a flat heat pipe. Please refer to FIG. 1, which is a flow chart of the method for sealing a heat transfer unit according to the first embodiment of the present invention. Please also refer to FIGS. 2A, 2B, 2C, 2D, and 3. In the current embodiment, a cylindrical heat pipe is used as an example of the heat transfer unit 1 for explanation. The method for sealing a heat transfer unit includes the following steps.

Step (100): providing a heat transfer unit having a chamber and forming at least one opening, wherein an inner wall of the chamber forms at least one wick structure, wherein a working fluid is filled in the chamber.

The heat transfer unit 1 which is a cylindrical heat pipe is provided. The heat transfer unit 1 has a chamber 11 therein; each of two ends of the heat transfer unit 1 has an opening 12 communicating with the chamber 11. An inner wall of the chamber 11 forms at least one wick structure 13. In the current embodiment, sintered powder is used as an example of the wick structure 13 for explanation, but not limited to this. In practice, the wick structure 13 may be grooves, a metal net, or a fiber net. A working fluid 14 (e.g., pure water, inorganic compound, alcohols, ketones, liquid metal, coolant, or organic compound) is filled in the chamber 11. Two dead zones 15 are individually defined between the wick structure 13 and each of the two opposite openings 12 at two ends of the heat transfer unit 1. The wick structure 13 is not formed in the dead zones 15, which helps the working fluid 14 be filled into the chamber 11. Therefore, the dead zones 15 of the heat transfer unit 1 cannot be used for heat transfer.

Step (101): welding the opening to form a welding section and close the opening.

Two openings 12 at two ends of the heat transfer unit 1 have the dead zones 15. In the current embodiment, the dead zones 15 are the portions which cannot carry out heat transfer on the heat transfer unit 1 and in which the wick structure 13 is not formed. Ultrasonic welding is performed on the dead zones 15 via ultrasonic welding equipment 5. The inner wall in the portion of welding is welded and closed. Also, a certain range of the inner wall is required to be closed during the ultrasonic welding. Thus, after the ultrasonic welding is performed on two openings 12 of the heat transfer unit 1, two welding sections 2 will be produced individually to close the individual openings 12. Besides, the chamber 11 is vacuumed during the closing process to become a vacuumed chamber 11.

Step (102): pinching off the welding section and cutting off part of the welding section to form a cutting end and complete sealing the opening of the heat transfer unit.

After the ultrasonic welding is performed, two ends of the heat transfer unit 1 individually form the welding section 2. Besides, a certain range of the welding section 2 is required to be closed during the welding. Therefore, the pinch-off equipment 6 is used to pinch off the welding section 2 and cut off part of the welding section 2. At the pinch-off location of the welding section 2, the pinch-off equipment 6 closes the welding section 2 again to form a cutting end 3 such that the welding section 2 and the cutting end 3 can be closed effectively and thus the heat transfer unit 1 is sealed.

Therefore, the design of the present invention can be directly applied in a common finished heat transfer unit 1, such as the above-mentioned cylindrical heat pipe, the flat heat pipe, the heat conducting plate or vapor chamber formed by an upper plate and an lower plate stacked to each other, to reduce the length of the dead zone 15 and minimize the area disposed by the dead zone 15. As a result, the heat conduction efficiency of the heat transfer unit 1 can be relatively improved. (That is, the heat transfer unit 1 is almost the effective area.). In addition, after the dead zone 15 is effectively reduced by means of the design of the present invention, the whole length of the heat transfer unit 1 can be effectively reduced, resulting in a heat transfer unit 1 with a short and small size. In this way, when the heat transfer unit 1 of the present invention is applied in a smart mobile device such as a smart watch, smart phone, or wearable device, it occupies little space and has a space saving effect, facilitating size reduction of smart mobile devices.

Please also refer to FIGS. 1, 4A, 4B, 4C, 4D, and 5, which are flow charts of a method for sealing a heat transfer unit according to the second preferred embodiment of the present invention. The current embodiment uses a flat heat pipe for explanation, instead of a cylindrical heat pipe as the heat transfer unit 1 of the first embodiment. In the current embodiment, the method for sealing a heat transfer unit mainly includes the following steps. First, a heat transfer unit 1 is provided, which is a finished product of the flat-pressed heat pipe. The heat transfer unit 1 has a chamber 11 therein; each of two ends of the heat transfer unit 1 has an opening 12. The inner wall of the chamber 11 forms the wick structure 13; the working fluid 14 is filled in the chamber 11. Two dead zones 15 are individually defined between the wick structure 13 of an inner wall of the heat transfer unit 1 and each of the two opposite openings 12 at two ends of the heat transfer unit 1. Then, the two ends of the heat transfer unit 1 form the welding sections 2 after the ultrasonic welding is performed. Next, the welding sections 2 are pinched off using the pinch-off equipment 6 and part of the welding sections 2 are cut off. At the pinch-off location of the welding section 2, the pinch-off equipment 6 closes the welding section 2 again to form a cutting end 3 such that the welding section 2 and the cutting end 3 can be closed effectively and thus the heat transfer unit 1 is sealed. In the way, after the dead zone 15 is effectively reduced by means of the design of the present invention, the whole length of the heat transfer unit 1 can be effectively reduced, resulting in a heat transfer unit 1 with a short and small size. Therefore, when the heat transfer unit 1 of the present invention is applied in a smart mobile device such as a smart watch, smart phone, or wearable device, it occupies little space and has a space saving effect, facilitating size reduction of smart mobile devices.

Please refer to FIGS. 1, 6A, 6B, 6C, 6D, and 7, which are flow charts of a method for sealing a heat transfer unit according to the third preferred embodiment of the present invention. The current embodiment uses a flat vapor chamber formed by an upper plate and a lower plate stacked to each other as an example of the heat transfer unit 1 for explanation, instead of the heat transfer unit 1 of the first embodiment. In the current embodiment, the method for sealing a heat transfer unit mainly includes the following steps. First, a heat transfer unit 1 is provided, which is a flat vapor chamber. The heat transfer unit 1 has a chamber 11 therein and a filling section 4 at one end thereof. An opening 12 is formed in the filling section 4. The inner wall of the chamber 11 is provided with the wick structure 13; the working fluid 14 is filled in the chamber 11. The wick structure 13 is not disposed in the filling section 4 and thus the filling section 4 is a dead zone 15 in the current embodiment. Next, the filling section 4 of the heat transfer unit 1 is welded by the ultrasonic welding to form a welding section 2. The welding sections 2 are pinched off using the pinch-off equipment 6 and part of the welding sections 2 are cut off. At the pinch-off location of the welding section 2, the pinch-off equipment 6 closes the welding section 2 again to form a cutting end 3 such that the welding section 2 and the cutting end 3 can be closed effectively and thus the heat transfer unit 1 is sealed. In the way, after the dead zone 15 is effectively reduced by means of the design of the present invention, the whole length of the heat transfer unit 1 can be effectively reduced, resulting in a heat transfer unit 1 with a short and small size. Thus, when the heat transfer unit 1 of the present invention is applied in a smart mobile device such as a smart watch, smart phone, wearable device, or tablet computer, it occupies little space and has a space saving effect, facilitating size reduction of smart mobile devices.

In summary, compared with the traditional method, the present invention has the following advantages.

1. The length of the dead zone can be reduced.
2. The heat conduction efficiency of the heat transfer unit can be improved.
3. The space is saved.

The above-mentioned embodiments are only the preferred ones of the present invention. All variations regarding the above method, shape, structure, and device according to the claimed scope of the present invention should be embraced by the scope of the appended claims of the present invention.

What is claimed is:

1. A method for sealing a heat pipe, including the steps of:
providing a heat pipe having a chamber and two openings formed at two ends of the heat pipe, wherein an inner wall of the chamber forms at least one wick structure, wherein the heat pipe is provided with a dead zone at a location of each opening, and the wick structure extends up to but is not contained in the dead zone;
pressing and welding the openings to form a welding section along the dead zone and close the openings;
pinching off part of the welding section using pinch-off equipment, and cutting off part of the welding section at a pinch-off location of the welding section, thereby reducing the length of the dead zone but not affecting the wick structure which remains extending through the heat pipe, and wherein pinching off part of the welding section forms a cutting end, and completely sealing the opening of the cutting end of the heat pipe, and the length of the dead zone being reduced to improve a heat conduction efficiency of the heat pipe.

2. The method for sealing the heat transfer unit according to claim 1, wherein the step of welding is performed by ultrasonic welding.

* * * * *